(12) United States Patent
Kokozaki et al.

(10) Patent No.: US 7,968,989 B2
(45) Date of Patent: Jun. 28, 2011

(54) MULTI-PACKAGE SLOT ARRAY

(75) Inventors: Camille Kokozaki, Norcross, GA (US); Jitesh Shah, Fremont, CA (US)

(73) Assignee: Integrated Device Technology, inc, San Jose, CA (US)

( * ) Notice: Subject to any disclaimer, the term of this patent is extended or adjusted under 35 U.S.C. 154(b) by 180 days.

(21) Appl. No.: 12/163,914

(22) Filed: Jun. 27, 2008

(65) Prior Publication Data

US 2009/0321905 A1    Dec. 31, 2009

(51) Int. Cl.
*H01L 23/02*    (2006.01)
*H01L 23/34*    (2006.01)

(52) U.S. Cl. ........ 257/685; 257/686; 257/712; 257/723; 257/724; 257/E25.023; 257/E25.013; 257/E23.169

(58) Field of Classification Search .................. 257/678, 257/758, 686, 723, 724, 685, 712, E25.023, 257/E25.013, E23.169; 439/630, 636, 79, 439/631; 361/633, 719, 737
See application file for complete search history.

(56) References Cited

U.S. PATENT DOCUMENTS

| | | | | |
|---|---|---|---|---|
| 5,004,434 A * | 4/1991 | Aiello et al. | .................. | 439/636 |
| 5,239,199 A * | 8/1993 | Chiu | ............................ | 257/706 |
| 5,327,327 A * | 7/1994 | Frew et al. | .................... | 361/784 |
| 5,343,366 A * | 8/1994 | Cipolla et al. | ................ | 361/785 |
| 5,604,377 A * | 2/1997 | Palagonia | ...................... | 257/685 |
| 5,684,675 A * | 11/1997 | Taniguchi et al. | ............ | 361/704 |
| 5,747,858 A * | 5/1998 | Hawkins | ........................ | 257/417 |
| 5,956,236 A * | 9/1999 | Corisis et al. | ................. | 361/783 |
| 6,005,776 A * | 12/1999 | Holman et al. | ............... | 361/760 |
| 6,088,237 A * | 7/2000 | Farnworth et al. | ........... | 361/796 |
| 6,320,253 B1 * | 11/2001 | Kinsman et al. | .............. | 257/686 |
| 6,407,923 B1 * | 6/2002 | Gerlock et al. | ............... | 361/704 |
| 6,472,744 B1 * | 10/2002 | Sato et al. | ..................... | 257/723 |
| 6,710,614 B1 * | 3/2004 | Wark | ............................ | 324/761 |
| 7,074,048 B2 * | 7/2006 | Liao et al. | ....................... | 439/66 |
| 2003/0022405 A1 * | 1/2003 | Song et al. | ...................... | 438/15 |
| 2005/0014308 A1 * | 1/2005 | Tseng et al. | .................. | 438/106 |
| 2005/0040511 A1 * | 2/2005 | Kinsman | ....................... | 257/686 |
| 2005/0061477 A1 * | 3/2005 | Mira | ............................ | 165/80.3 |
| 2005/0230083 A1 * | 10/2005 | Hsieh | ........................... | 165/80.4 |
| 2006/0043989 A1 * | 3/2006 | Ko | ................................. | 324/755 |
| 2006/0049502 A1 * | 3/2006 | Goodwin et al. | ............. | 257/686 |
| 2006/0202328 A1 * | 9/2006 | Braun et al. | ................... | 257/723 |
| 2008/0088326 A1 * | 4/2008 | Volkerink et al. | ............. | 324/754 |

* cited by examiner

*Primary Examiner* — Teresa M Arroyo
(74) *Attorney, Agent, or Firm* — Bever, Hoffman & Harms (57) ABSTRACT

A multi-package module that includes a multi-layer interconnect structure, a housing structure attached to the multi-layer interconnect structure, and a plurality of integrated circuit packages inserted into slots in the housing structure, and placed into contact with the multi-layer interconnect structure. The integrated circuit packages can be removed from the slots in the housing structure, thereby enabling testing and/or replacement of the integrated circuit packages.

4 Claims, 12 Drawing Sheets

FIG. 12

MULTI-PACKAGE SLOT ARRAY

FIELD OF THE INVENTION

The present invention relates to a semiconductor device that includes a plurality of chips connected within a common structure.

RELATED ART

Figure 1:
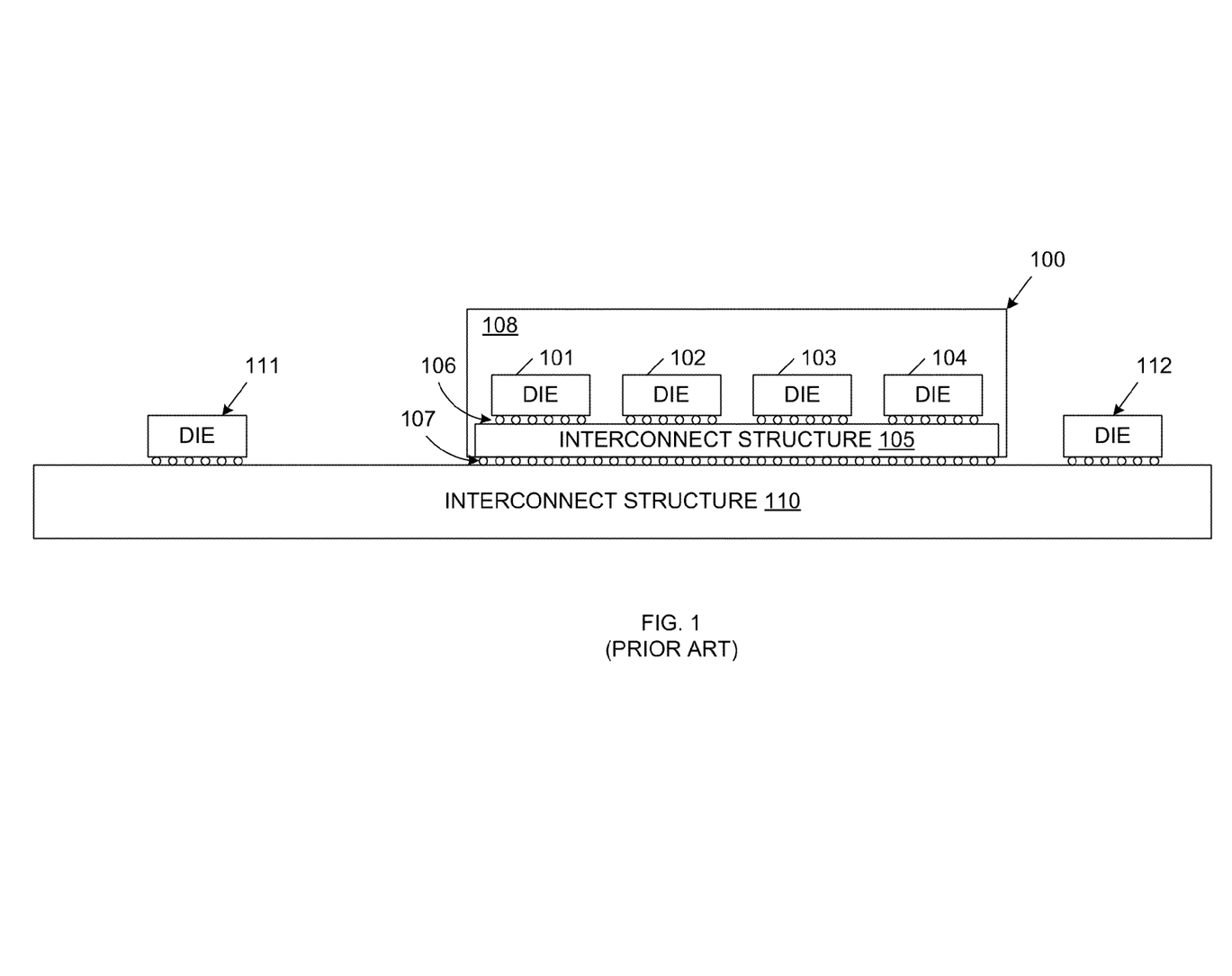
FIG. 1 is a block diagram of a conventional multi-chip module.

FIG. 1 is a block diagram of a conventional multi-chip module 100, which is mounted to an interconnect structure 110, along with one or more other semiconductor devices 111-112. Multi-chip module 100 includes a plurality of semiconductor dice 101-104, an interconnect structure 105, interconnect means 106-107 and module package 108. Semiconductor dice 101-104 are fixedly connected to interconnect structure 105 by interconnect means 106 (e.g., solder balls). Interconnect structure 105 provides connections between the various dice 101-104, and also provides connections to interconnect means 107 (e.g., solder balls). Module housing 108 permanently encapsulates dice 101-104, interconnect structure 105 and interconnect means 106, but exposes the interconnect means 107 at the lower surface of interconnect structure 105. By assembling multiple dice 101-104 in the same module 100, the density of the resulting system is increased.

However, if a single bad die is included in the assembled multi-chip module 100, the entire module 100 will fail to function properly. It is either impossible or very difficult to individually test the functionality of each die after the multi-chip module 100 has been assembled. For this reason, it is necessary to verify that each of the dice 101-104 is a 'known good die' prior to assembling the multi-chip module 100. This pre-assembly testing adds to the cost of multi-chip module 100.

Multi-chip module 100 must be assembled before the entire module 100 can be tested for functionality. If multi-chip module 100 fails post-assembly testing, all four semiconductor dice 101-104 are rendered 'unusable', thereby undesirably resulting in reduced yield. In addition, after assembly, the hardware included within multi-chip module 100 cannot be upgraded.

It would therefore be desirable to have a modular system that overcomes the above-described deficiencies of conventional multi-chip module systems.

SUMMARY

Accordingly, the present invention provides a multi-package module that includes an interconnect structure having a plurality of interconnect terminals located at an upper surface thereof, a housing structure attached to the interconnect structure, the housing structure having plurality of slots through which the interconnect terminals are exposed, and a plurality of integrated circuit packages, each having a plurality of contact terminals located along a first planar surface thereof, wherein each of the integrated circuit packages is positioned within a corresponding one of the slots of the housing structure, such that the contact terminals of each integrated circuit package are electrically connected to a corresponding set of the interconnect terminals of the interconnect structure, and wherein the first planar surface of each of the integrated circuit packages is perpendicular to the upper surface of the interconnect structure.

The integrated circuit packages can be independently removed from the slots of the housing structure, thereby enabling the integrated circuit packages to be tested and/or replaced after assembly of the multi-package module.

The present invention will be more fully understood in view of the following description and drawings.

DETAILED DESCRIPTION

Figure 2:
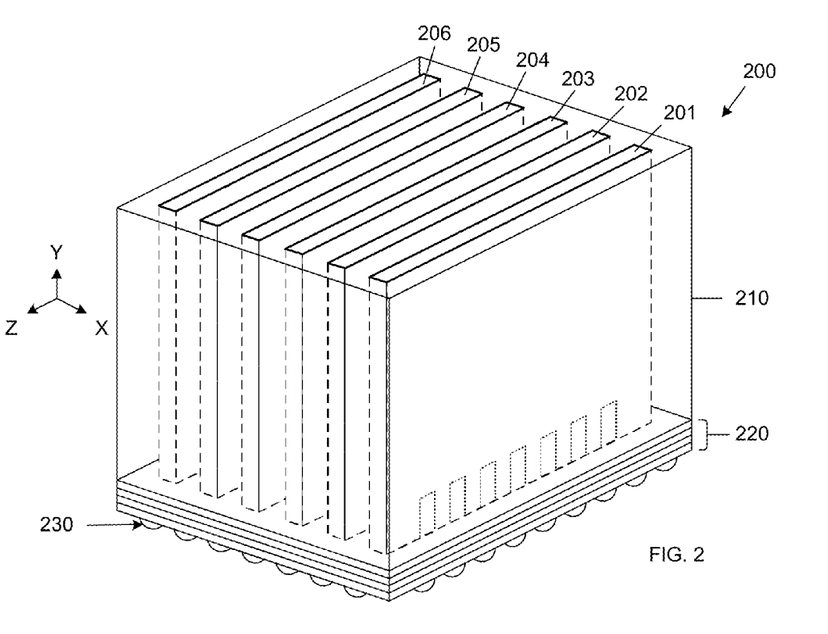
FIG. 2 is an isometric view of a multi-package module in accordance with one embodiment of the present invention.
Figure 3:
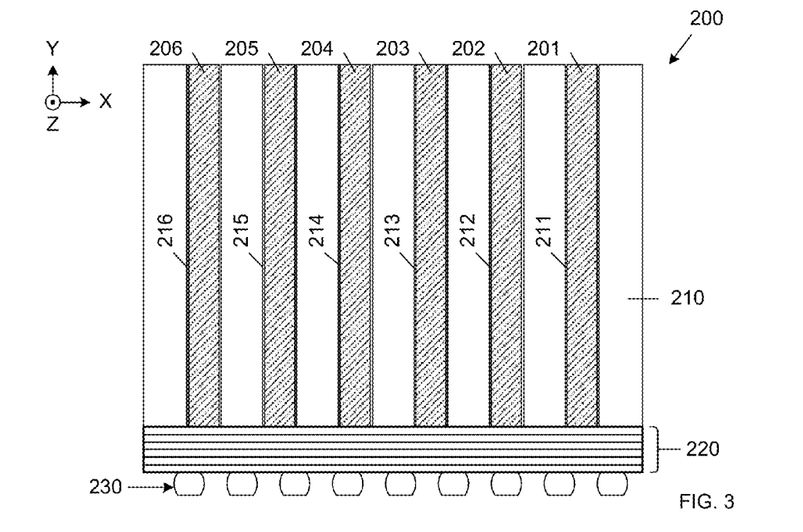
FIG. 3 is a cross sectional view of the multi-package module of FIG. 2 in accordance with one embodiment of the present invention.

FIG. 2 is an isometric view of a multi-package module 200 in accordance with one embodiment of the present invention. FIG. 2 is labeled using an X-Y-Z coordinate system, which is used throughout the present specification. FIG. 3 is a cross sectional view of multi-package module 200 of FIG. 2 through a plane parallel to the X-Y plane. Multi-package module 200 includes a plurality of integrated circuit packages 201-206, a package housing structure 210, a multi-layer interconnect structure 220, and a solder ball array 230. Package housing structure 210 is attached to multi-layer interconnect structure 220. More specifically, the lower planar surface of package housing structure 210 is affixed to the upper planar surface of multi-layer interconnect structure 220. In the described embodiments, package housing structure 210 can be made of a plastic or ceramic material. It is desirable for package housing structure 210 to be rigid, lightweight, thermally conductive, and have a thermal coefficient of expansion matched to the materials in multi-layer interconnect structure 220 and integrated circuit packages 201-206. In a particular embodiment, package housing structure 210 is affixed to multi-layer interconnect structure 220 using an adhesive. In other embodiments, other means for affixing package housing structure 210 to multi-layer interconnect structure 220 may be used.

Open slots 211-216 extend through package housing structure 210 as illustrated in FIG. 3. More specifically, each of the slots 211-216 extends through package housing structure 210, between the upper planar surface and the lower planar surface of package housing structure 210. Slots 211-216 are sized to closely receive corresponding integrated circuit packages 201-206. Integrated circuit packages 201-206 are inserted into slots 211-216, respectively, such that a lower portion of each integrated circuit package is placed into contact with multi-layer interconnect structure 220. More specifically, contact terminals on integrated circuit packages 201-206 are held in electrical contact with corresponding electrical contact terminals on multi-layer interconnect structure 220. The interface between integrated circuit packages 201-206 and multi-layer interconnect structure 220 is described in more detail below. When inserted into slots 211-216, integrated circuit packages 201-206 are positioned perpendicular to the X-Z plane.

In accordance with one embodiment, integrated circuit packages 201-206 are held within slots 211-216 by friction. In another embodiment, integrated circuit packages 201-206 are held within slots 211-216 by a lid that is fitted over the upper planar surface of package housing structure 210.

Figure 4A:
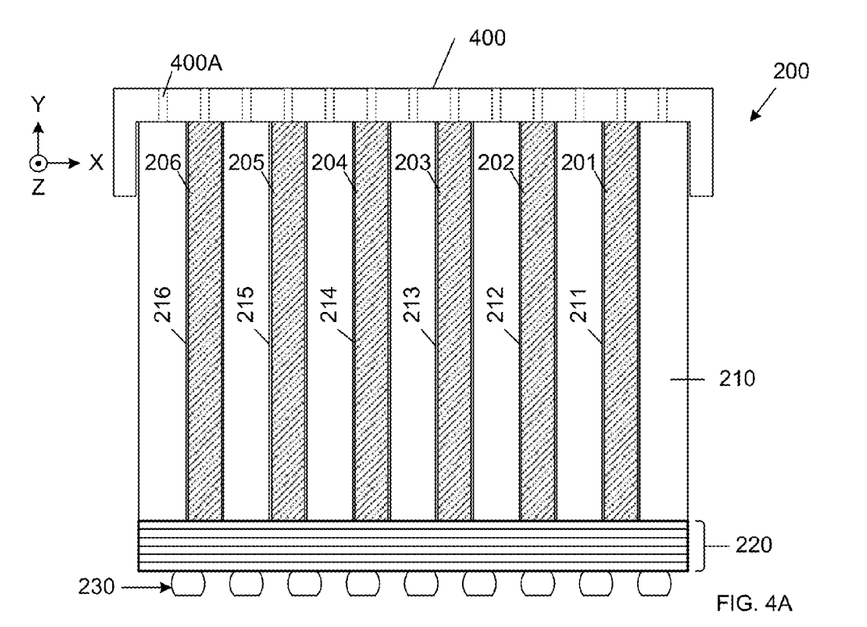
FIGS. 4A and 4B are cross sectional views of the multi-package module of FIG. 2, wherein lids are included in accordance with various embodiments of the present invention.

FIG. 4A is a cross sectional view of multi-package module 200 of FIG. 2 through a plane parallel to the X-Y plane, wherein a lid 400 is attached to the upper surface of the package housing structure 210. Lid 400 may be held in place by friction between the lid 400 and package housing structure 210. Lid 400 may include a plurality of ventilation openings, such as opening 400A, which allow heat to escape from the upper regions of package housing structure 210 and integrated circuit packages 211-216.

Figure 4B:
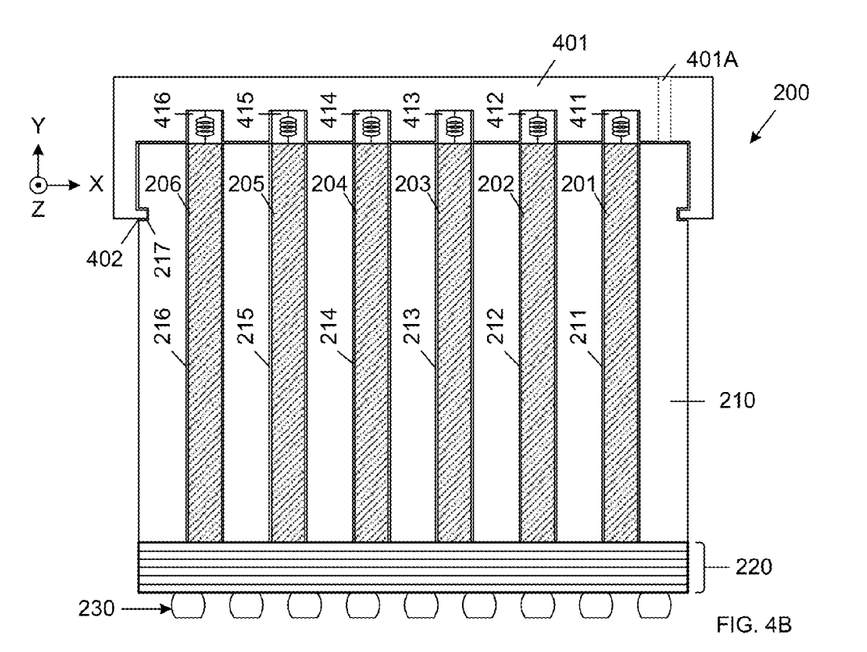

FIG. 4B is a cross sectional view of multi-package module 200 of FIG. 2 through a plane parallel to the X-Y plane, wherein an alternate lid 401 is attached to the upper surface of the packaging housing structure 210. Lid 401 includes a retaining ridge structure 402, which is inserted into a corresponding retaining groove structure 217 formed in package housing structure 210, thereby helping to retain lid 401 on package housing structure 210. Lid 401 also includes optional spring loaded elements 411-416, which force corresponding integrated circuit packages 201-206 down into slots 211-216. Spring loaded elements 411-416 may be, for example, an elastomeric material, which becomes compressed when lid 401 is attached to package housing structure 210. In one variation, spring loaded elements 411-416 may be replaced with a single spring loaded element, which forces all of the integrated circuit packages 201-206 down into slots 211-216. Ventilation openings, such as opening 401A may be formed through lid 401 to allow heat to escape through lid 401.

In accordance with one embodiment, lids 400 and 401 can be removed from package housing structure 210 without requiring excessive force that could damage package housing structure 210 (or integrated circuit packages 201-206). That is, lids 400 and 401 are 'removably attached' to package housing structure 210.

Figure 5:
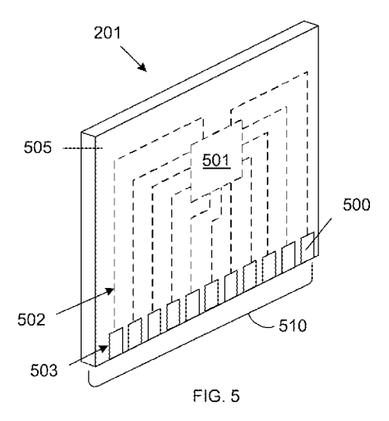
FIG. 5 is an isometric view of an integrated circuit package that is included in the multi-package module of FIG. 2, in accordance with one embodiment of the present invention.

FIG. 5 is an isometric view of an integrated circuit package 201, in accordance with one embodiment of the present invention. Integrated circuit package 201 includes an integrated circuit 501, which is supported and enclosed in a package body 505. Integrated circuit 501 may include, for example, a processor and/or memory. Electrical conductors 502 extend through the package body 505 to connect the integrated circuit 501 with electrical contact terminals 503, which are exposed at an outer surface of the package body 505. Contact terminals 503 are located along a single edge 510 of the integrated circuit package 201. As described in more detail below, contact terminals 503 may be single-surface elements, dual-surface elements or triple-surface elements.

Figures 6A, 6B:
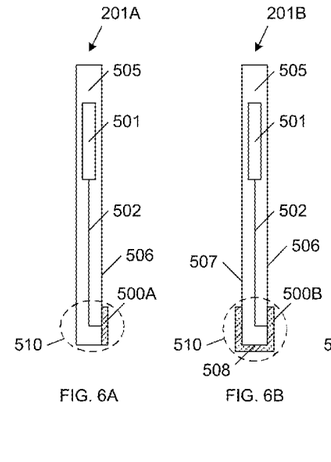
FIG. 6A is a side view of an integrated circuit package used to implement a single-surface contact terminal embodiment, in accordance with one embodiment of the present invention.
FIG. 6B is a side view of an integrated circuit package used to implement a triple-surface contact terminal embodiment, in accordance with one embodiment of the present invention.
Figure 6C:
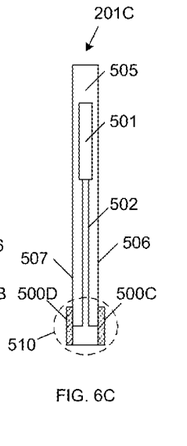
FIG. 6C is a side view of an integrated circuit package used to implement a dual-surface contact terminal embodiment, in accordance with one embodiment of the present invention.

FIGS. 6A, 6B and 6C are cross sectional views of the integrated circuit package of FIG. 5, which illustrate how the contact terminals 503 may be implemented in various embodiments of the present invention.

FIG. 6A illustrates a single-surface contact terminal embodiment, wherein the integrated circuit package of FIG. 5 is labeled as integrated circuit package 201A. In this embodiment, each of the contact terminals 503 are located entirely on the same vertical surface of the package body 505. As illustrated in FIG. 6A, single-surface contact terminal 500A (which is representative of each of the contact terminals 503 of integrated circuit package 201A) is located only on the vertical surface 506 of integrated circuit package 201A.

FIG. 6B illustrates a triple-surface contact terminal embodiment, wherein the integrated circuit package of FIG. 5 is labeled as integrated circuit package 201B. In this embodiment, each of the contact terminals 503 extend over opposing vertical surfaces of the package body and an adjoining horizontal surface of the package body. As illustrated in FIG. 6B, triple-surface contact terminal 500B (which is representative of each of the contact terminals 503 of integrated circuit package 201B) extends over the opposing vertical surfaces 506-507 and the adjoining horizontal surface 508 of integrated circuit package 201B.

FIG. 6C illustrates a dual-surface contact terminal embodiment, wherein the integrated circuit package of FIG. 5 is labeled as integrated circuit package 201C. In this embodiment, a first set of the contact terminals 503 are located entirely on a first vertical surface of the package body 505, and a second set of the contact terminals 503 are located entirely on a second vertical surface of the package body 505, opposite the first vertical surface. As illustrated in FIG. 6C, dual-surface contact terminal 500C (which is representative of each of the contact terminals in a first set of the contact terminals 503) extends over vertical surface 506 of the integrated circuit package 201C, and dual-surface contact terminal 500D (which is representative of each of the contact terminals in a second set of the contact terminals 503) extends over vertical surface 507 of the integrated circuit package 201C. Contact terminals 500C and 500D have independent electrical connections to integrated circuit 501.

Figure 7A:
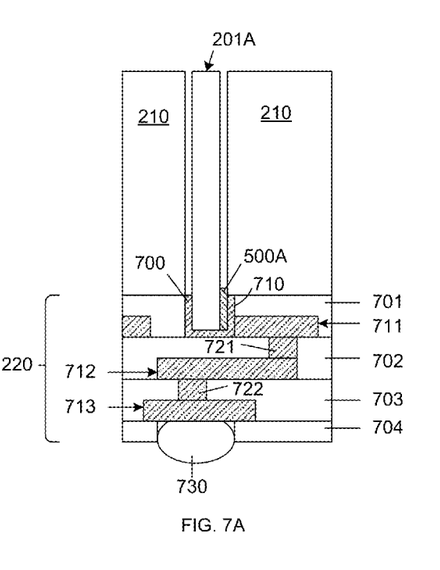
FIGS. 7A, 7B and 7C are cross sectional views that illustrate the manner in which the integrated circuit packages of FIGS. 6A, 6B and 6C, respectively, may be placed into contact with a multi-layer interconnect structure, in accordance with various embodiments of the invention.
Figure 7B:
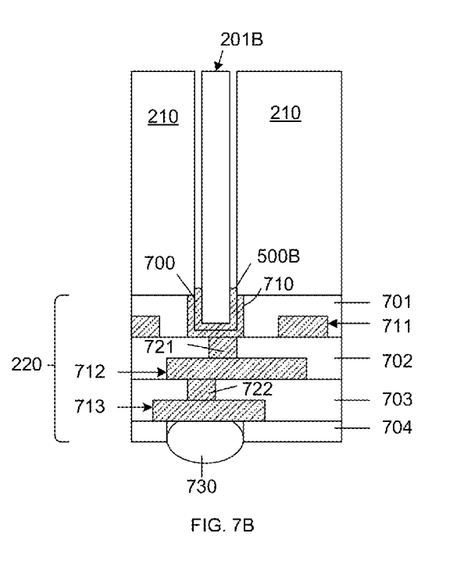
Figure 7C:
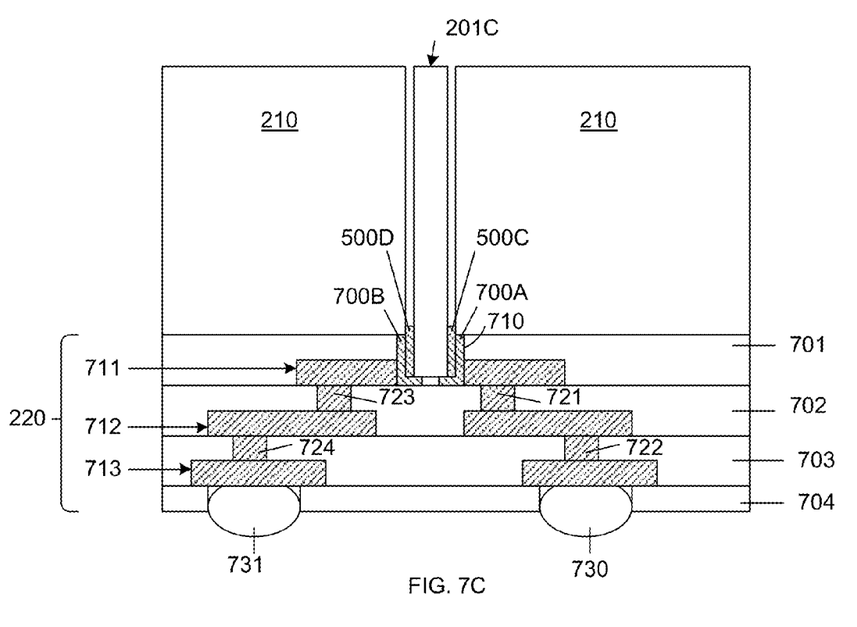

FIGS. 7A, 7B and 7C are cross sectional views that illustrate the manner in which the integrated circuit packages 201A, 201B and 201C of FIGS. 6A, 6B and 6C, respectively, may be placed into contact with the multi-layer interconnect structure 220 in accordance with various embodiments of the invention. In general, the multi-layer interconnect structure 220 includes a plurality of conductive layers (each including conductive traces), interleaved with a plurality of insulating layers. Conductive plugs may be formed in vias formed through the insulating layers, thereby providing connections between conductive traces in different conductive layers.

For example, as illustrated in FIG. 7A, multi-layer interconnect structure 220 includes insulating layers 701-704, conductive layers 711-713, and via plugs 721-722. Although FIG. 7A shows four insulating layers and three conductive layers, it is understood that multi-layer interconnect structure 220 may have other numbers of insulating and conducive layers in other embodiments.

A ditch/notch 710 is formed in the upper insulating layer 701 at the upper surface of multi-layer interconnect structure 220. Ditch/notch 710 is dimensioned to receive the lower edge 510 of integrated circuit package 201A.

A plurality of separate U-shaped electrically conductive connector terminals are formed within ditch/notch 710 using a plating process. Each of the separate connector terminals formed within ditch/notch 710 is positioned to contact a corresponding one of the contact terminals 503 on integrated circuit package 201A. For example, connector terminal 700 is formed in ditch notch 710, such that the single-surface contact terminal 500A of the integrated circuit package 201A (FIG. 6A) will be placed into electrical contact with connector terminal 700 when integrated circuit package 201A is inserted into slot 211 of package housing structure 210. This relationship is illustrated in FIG. 7A.

Each of the connector terminals formed within ditch/notch 710 contacts a corresponding conductive element within multi-layer interconnect structure 220. For example, connector terminal 700 contacts a conductive trace in the first conductive layer 711. In the illustrated example, connector terminal 700 is electrically connected to solder bump 730 (of solder bump array 230) by conductive traces in conductive layers 711-713 and via plugs 721-722. As a result, electrical signals can be transmitted between solder bump 730 and the integrated circuit 501 of integrated circuit package 201A.

FIG. 7B illustrates the triple-surface contact terminal 500B of the integrated circuit package 201B (FIG. 6B) in contact with the connector terminal 700 in multi-layer interconnect structure 220. Note that the triple-surface contact terminal 500B provides improved contact with connector terminal 700. FIG. 7B also illustrates that the connector terminal 700 may alternately be formed directly on conductive via plug 721, such that a direct electrical connection exists between connector terminal 700 and via plug 721 (i.e., connector terminal 700 does not contact the first conductive layer 711 as in FIG. 6A). The connections made to connector terminal 700 in FIGS. 7A and 7B are interchangeable among the various embodiments.

In an alternate embodiment that implements the triple-surface contact terminal 500B, the connector terminal 700 may fill ditch/notch 710, such that the upper surface of the connector terminal 700 is substantially level with the upper surface of insulating layer 701.

FIG. 7C illustrates the dual-surface contact terminals 500C and 500D of the integrated circuit package 201C (FIG. 6C) in contact with separate (isolated) connector terminals 700A and 700B formed in the ditch/notch 710 of multi-layer interconnect structure 220. Contact terminal 500C is electrically connected to solder ball 730 through connector terminal 700A, conductive traces in the conductive layers 711-713, and via plugs 721-722. Similarly, contact terminal 500D is electrically connected to solder ball 731 through connector terminal 700B, conductive traces in conductive layers 711-713 and via plugs 723-724.

In accordance with another embodiment, spring-loaded clip elements may be formed within ditch/notch 710 of FIGS. 7A-7C, wherein the integrated circuit packages are engaged with the spring-loaded clip elements.

Figure 7D:
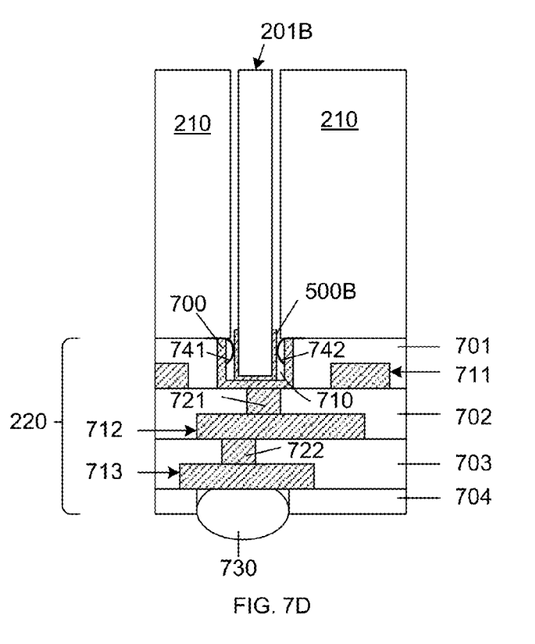
FIG. 7D is a cross-sectional view that illustrates the integrated circuit package of FIG. 7B, engaged with spring-loaded clip elements in accordance with another embodiment of the present invention.

FIG. 7D is a cross-sectional view that illustrates the integrated circuit package 201B engaged with spring-loaded clip elements 741-742 in multi-layer interconnect structure 220. In this embodiment, spring clips 741-742 are leaf springs, which are attached at the upper surface of multi-layer interconnect structure 220. When integrated circuit package 201B is inserted all the way into slot 211, spring clips 741-742 are compressed, and engage opposite surfaces of integrated circuit package 201B, thereby helping to retain integrated circuit package 201B in contact with connector terminal 700.

In accordance with one embodiment of the present invention, integrated circuit packages 201-206 can be removed from package housing structure 210 (after they have been inserted into package housing structure 210). That is, integrated circuit packages 201-206 are removably inserted into package housing structure 210. Integrated circuit packages 201-206 can be removed from package housing structure 210 for testing or replacement.

Figure 8A:
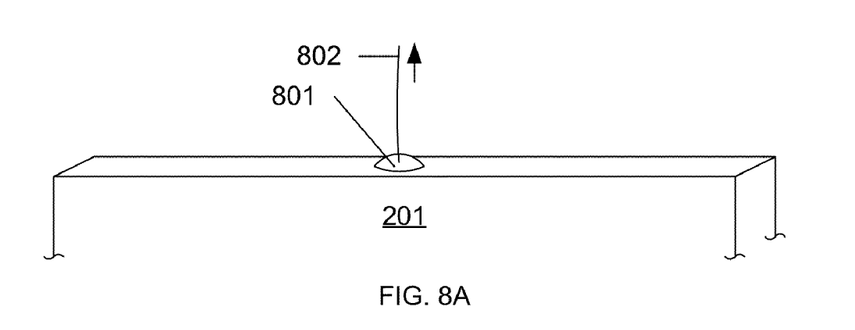
FIGS. 8A, 8B and 8C are isometric views illustrating various methods for removing an integrated circuit package from a package housing structure, in accordance with various embodiments of the present invention.
Figure 8B:
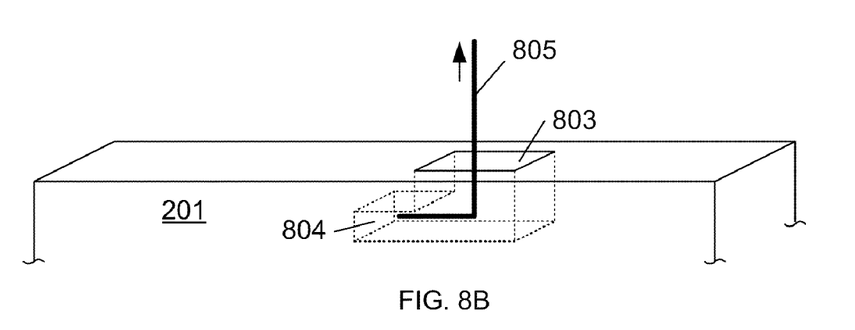
Figure 8C:
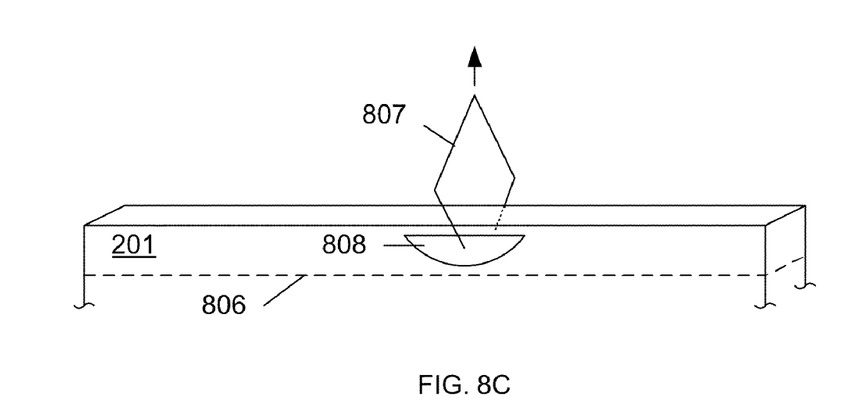

FIGS. 8A-8C illustrate various methods for removing integrated circuit package 201 from package housing structure 210.

As illustrated in FIG. 8A, an adhesive 801 may be applied to the top exposed surface of integrated circuit package 201 to attach a mechanical pulling element 802. An upward force is then applied to the pulling element 802 to remove the integrated circuit package 201 from the package housing structure 210. Adhesive 801/pulling element 802 may be attached to integrated circuit package 201 either before or after integrated circuit package 201 is inserted into package housing structure 210.

As illustrated by FIG. 8B, an opening 803 having a catch element 804 may be formed in the top surface of the integrated circuit package 201, wherein a mechanical pulling element 805 may be inserted into the opening 803 and engage with the catch element 804. An upward force is then applied to the pulling element 805 to remove the integrated circuit package 201 from the package housing structure.

As illustrated in FIG. 8C, the integrated circuit package 201 may be sized such that the uppermost portion of the package (i.e., the portion above dashed line 806) extends above the upper surface of the package housing structure 210 when the integrated circuit package circuit 201 is fully inserted into the package housing structure 210. This exposed portion of integrated circuit package 201 may be engaged by a mechanical grabbing element 807, which is then pulled upward to remove the integrated circuit package 201 from the package housing structure 210. Features 808 (e.g., ridges or grip pads) may be included on the exposed portion of integrated circuit package 201 to facilitate gripping.

Although several methods for removing integrated circuit package 201 from package housing structure 210 have been described, the present invention is not intended to be limited to these methods. One of ordinary skill would readily be able to determine other methods for removing integrated circuit package 201 from package housing structure 210.

The ability to remove the integrated circuit packages 201-206 from the package housing structure 210 eliminates (or at least relaxes) the need for each integrated circuit package to be a known good package before being inserted into the package housing structure 210. That is, the plurality of integrated circuit packages 201-206 may be inserted into package housing structure 210, and the resulting multi-package module 200 can be tested, without first testing the individual integrated circuit packages 201-206. If the multi-package module 200 passes the testing, then the need to individually test six integrated circuit packages 201-206 is eliminated. If the multi-package module 200 fails the testing, then the integrated circuit packages 201-206 can be removed from the package housing structure 210 and be individually tested. This process can greatly reduce the testing requirements of the multi-package module 200 (when compared with a conventional multi-chip module 100).

Moreover, if a functioning multi-package module 200 suddenly becomes non-functional, it is possible to remove the individual integrated circuit packages 201-206 from the package housing structure 210, and individually test these integrated circuit packages for failure. A failing integrated circuit package may be replaced with a new integrated circuit package, thereby extending the life of the multi-package module 200.

Moreover, it is possible to make upgrades to the multi-package module 200 by replacing one or more of the integrated circuit packages 201-206 with new integrated circuit packages (e.g., integrated circuit packages having faster processing power or more memory capacity.)

Moreover, it is possible to make upgrades to multi-package module 200 by adding new integrated circuit packages to previously unused slots of the package housing structure 210. For example, a base version of a product may be implemented by including integrated circuit packages 201-205 in the multi-package module 200 (wherein integrated circuit package 206 is simply not included in slot 216 of package housing structure 210), and an upgraded version of the product may be implemented by including all of the integrated circuit packages 201-206 in the multi-package module 200.

Modifications can be made to package housing body 210 in accordance with different variations of the present invention. These modifications are described below.

Figure 9:
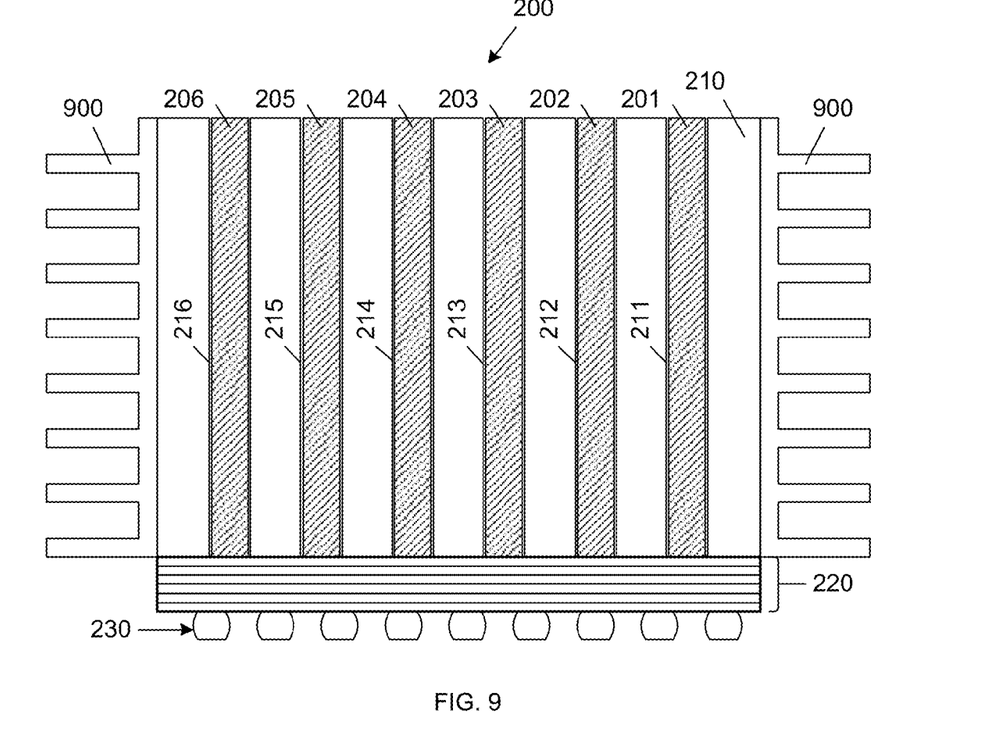
FIG. 9 is a cross sectional view of a multi-package module system that includes a heat sink in accordance with one variation of the present invention.

FIG. 9 is a cross sectional view of multi-package module 200 in accordance with an alternate embodiment, wherein a heat sink 900 is attached to four lateral outer surfaces of package housing body 210. Heat sink 900 is a thermally conductive material, such as copper or aluminum, which effectively dissipates heat generated within the integrated circuit packages 201-206. Note that a lid (see, e.g., FIGS. 4A-4B) may be located over the multi-package module 200 of FIG. 9.

Figure 10A:
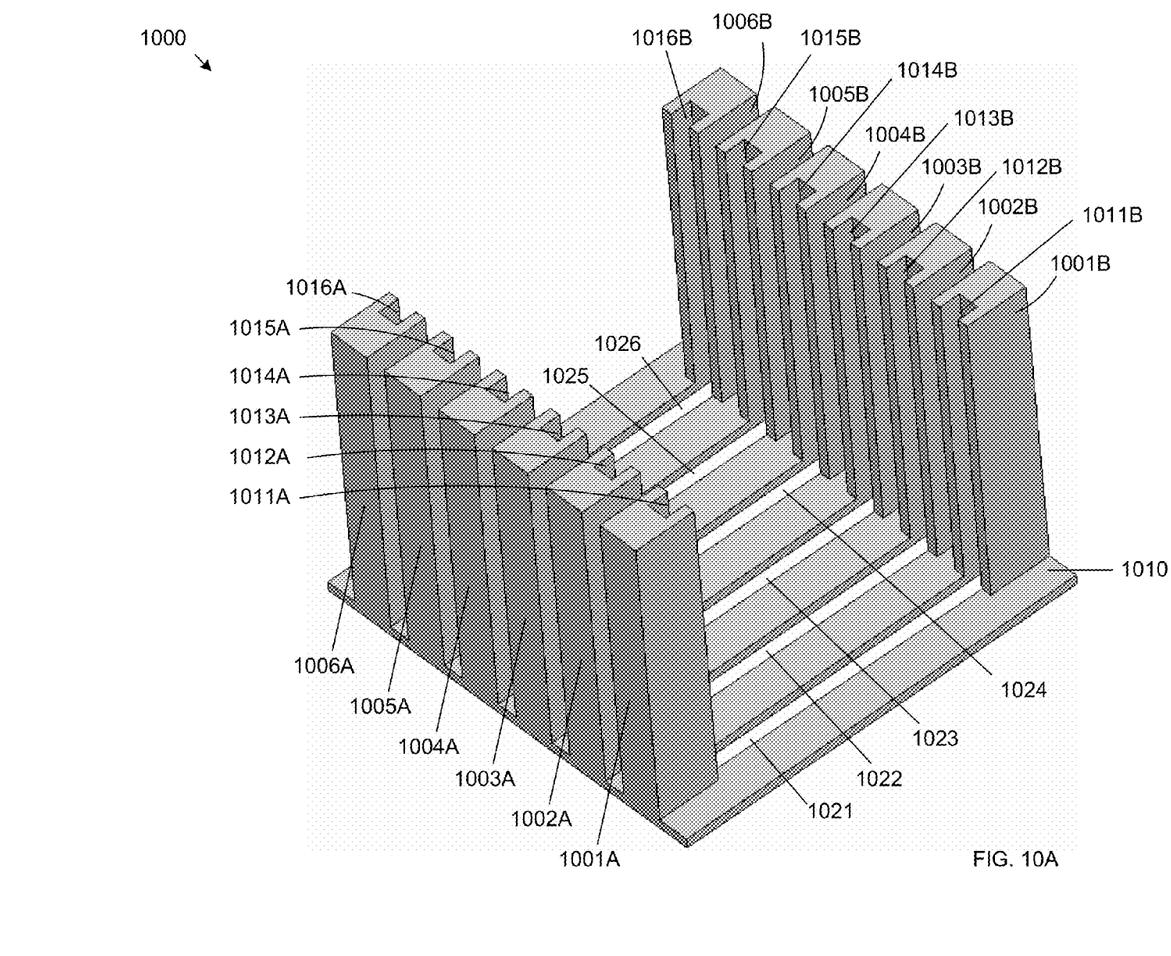
FIG. 10A is an isometric view of a package housing structure in accordance with an alternate embodiment of the present invention.

FIG. 10A is an isometric view of a package housing structure 1000 in accordance with an alternate embodiment of the present invention. In the described embodiment, package housing structure 1000 is made of a plastic. In other embodiments, other materials can be used to make package housing structure 1000. As illustrated in FIG. 10A, package housing structure 1000 includes a base 1010 and a plurality of fingers 1001A-1006A and 1001B-1006B, which extend perpendicularly upward from the base 1010. Fingers 1001A-1006A and 1001B-1006B include grooves 1011A-1016A and 1011B-1016B, respectively. Grooves 1011A-1016A are aligned with grooves 1011B-1016B, respectively. These aligned groove pairs 1011A-1011B, 1012A-1012B, 1013A-1013B, 1014A-1014B, 1015A-1015B and 1016A-1016B are dimensioned to receive integrated circuit packages 201-206, respectively. A plurality of slots 1021-1026 extend through base 1010. Slots 1021-1026 are aligned with the aligned groove pairs 1011A-1011B, 1012A-1012B, 1013A-1013B, 1014A-1014B, 1015A-1015B and 1016A-1016B, respectively. Slots 1021-1026 are dimensioned to receive the lower edges of integrated circuit packages 201-206, respectively. The integrated circuit packages 201-206 extend through slots 1021-1026, respectively, to contact the underlying multi-layer interconnect structure 220 (not shown in FIG. 10A).

Figure 10B:
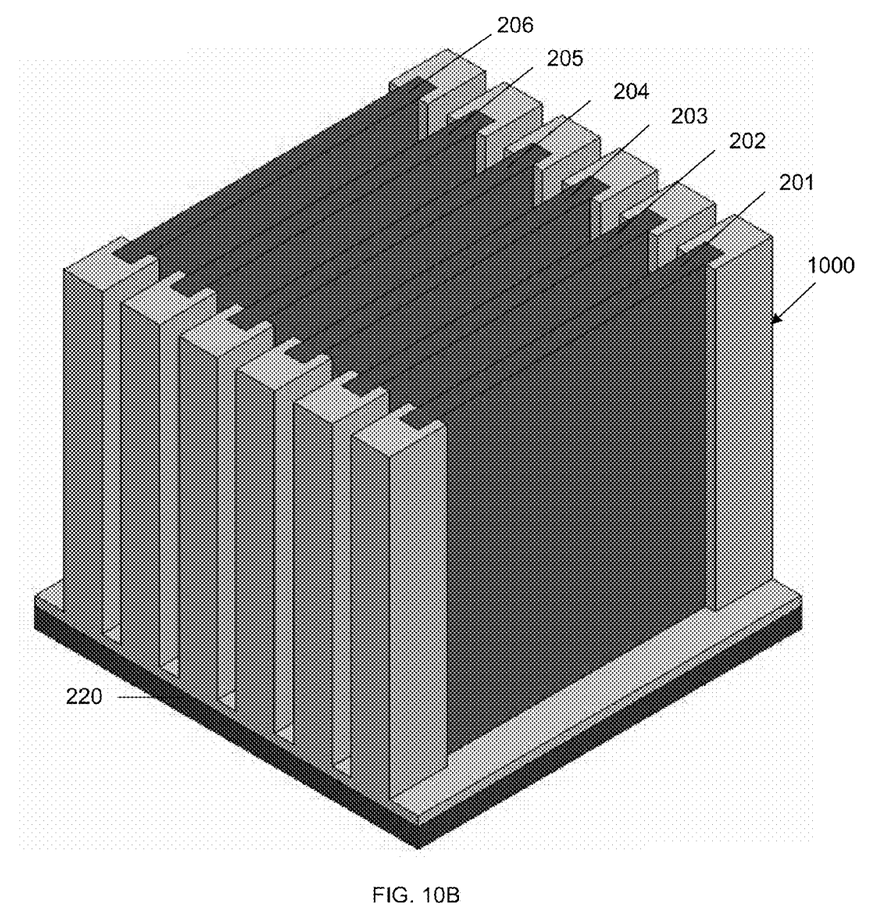
FIG. 10B is an isometric view of the package housing structure of FIG. 10A, with integrated circuit packages installed therein.

FIG. 10B is an isometric view of a package housing structure 1000 mounted on multi-layer interconnect structure 220, with integrated circuit packages 201-206 installed. Note that open space exists between adjacent integrated circuit packages, thereby facilitating the removal of the integrated circuit packages 201-206 from the package housing structure 1000. For example, the mechanical grabbing element 807 (FIG. 8C) may readily grab opposing surfaces of any of the integrated circuit packages 201-206, thereby enabling the integrated circuit package to be pulled out of the package housing structure 1000.

The open spaces between adjacent integrated circuit packages 201-206 within package housing structure 1000 also facilitates the introduction of air flow between the integrated circuit packages 201-206, for the purpose of cooling these integrated circuit packages. In accordance with one embodiment, the package housing structure 1000 is expanded to include a structure (e.g., a pair of fingers and a corresponding slot) for holding a fan module that introduces an air flow across integrated circuit packages 201-206. The fan module can be connected to (and receive power from) the multi-layer interconnect structure 220.

Figure 11:
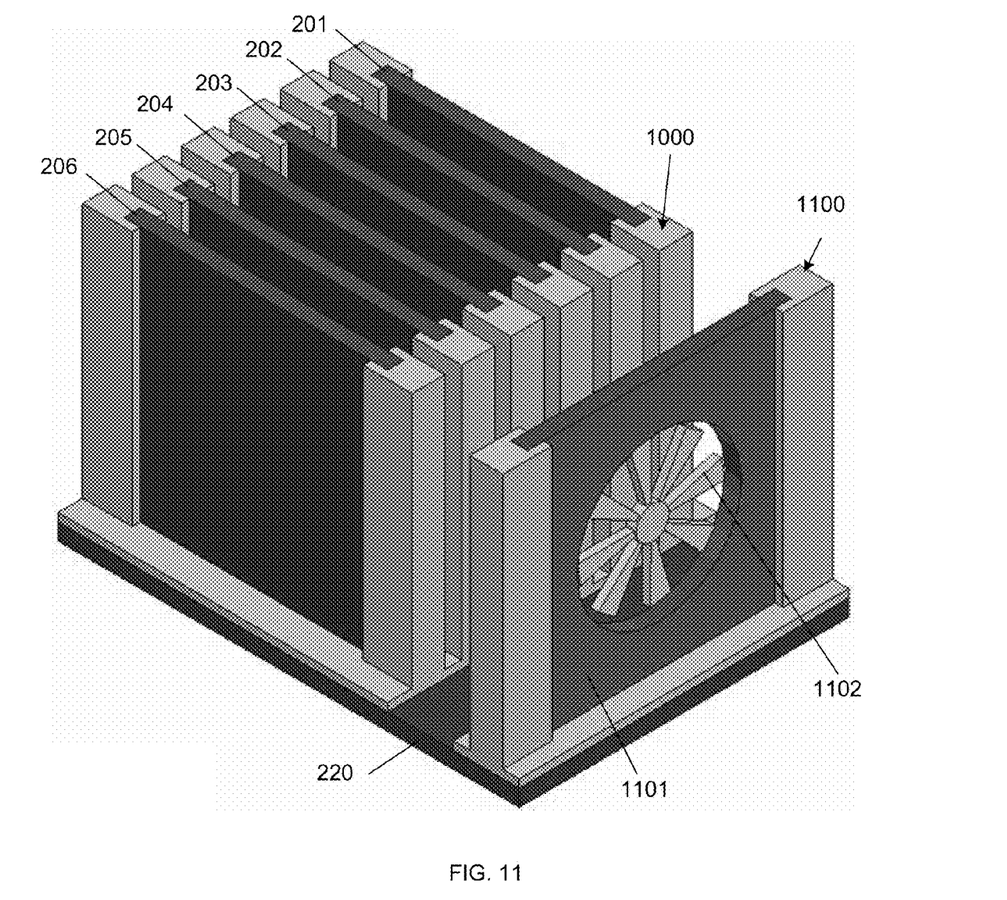
FIG. 11 is an isometric view of a package housing structure capable of holding a fan module in accordance with one embodiment of the present invention.

FIG. 11 is an isometric view of a multi-package module that includes package housing structure 1000 and fan housing structure 1100, mounted on the same multi-layer interconnect structure 220, in accordance with one embodiment of the present invention. Integrated circuit packages 201-206 are installed in package housing structure 1000, and a fan module 1101 is installed in fan housing module 1100. Fan module 1101 includes a fan 1102, which receives power via the multi-layer interconnect structure 220. Although fan 1102 is shown 'floating' within fan module 1101, it is understood that mounting brackets (not shown) actually support fan 1102 on fan module 1101. Fan module 1101 contacts the underlying multi-layer interconnect structure 220 through a slot (not seen) formed through the base of fan housing structure 1100. Fan module 1101 introduces an air flow across integrated circuit packages 201-206, thereby cooling these packages during normal operation. Although package housing structure 1000 and fan housing structure 1100 are illustrated as separate elements in FIG. 11, it is understood that these housing structures 1000 and 1100 can be formed as a single continuous element (e.g., sharing a common base) in an another embodiment.

Figure 12:
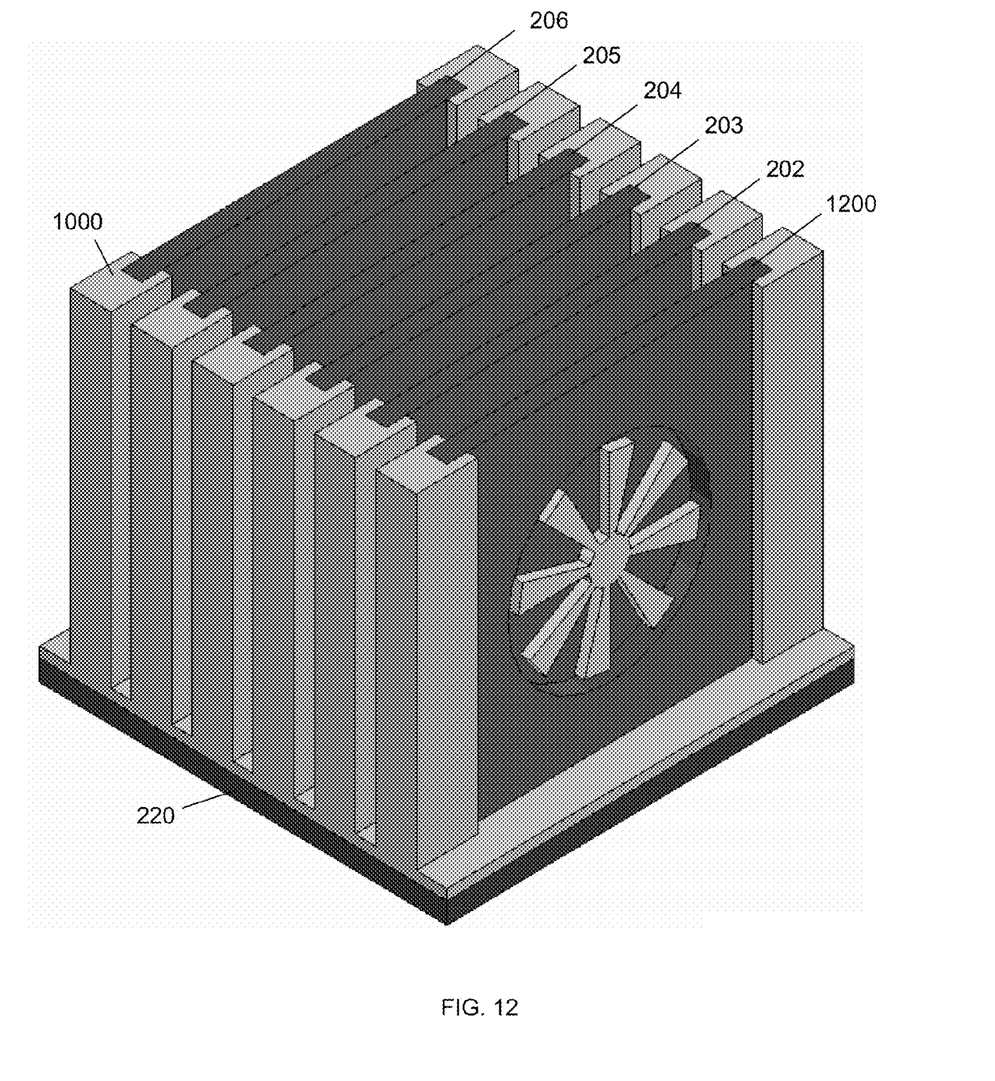
FIG. 12 is an isometric view of a package housing structure capable of holding a fan module in accordance with an alternate embodiment of the present invention.

FIG. 12 is an isometric view of a fan module 1200 inserted into the package housing structure 1000 in place of integrated circuit module 201, in accordance with another embodiment of the present invention. It is understood that the air flow introduced by fan module 1200 may not cool the associated integrated circuit packages 202-206 with the same efficiency as fan module 1101, due to the different orientations of these fan modules.

Although the present invention has been described in connection with various embodiments, it is understood that variations of these embodiments would be obvious to one of ordinary skill in the art. Thus, the present invention is limited only by the following claims.

We claim:
1. A multi-package module comprising:
an interconnect structure having a plurality of interconnect terminals located over a first surface thereof;
a housing structure attached to the interconnect structure, the housing structure having plurality of slots through which the interconnect terminals are exposed;

a plurality of integrated circuit packages, each having a first set of contact terminals located along a first surface thereof, wherein each of the integrated circuit packages is positioned within a corresponding one of the slots of the housing structure, such that the first set of contact terminals of each integrated circuit package are in contact with a corresponding set of the interconnect terminals of the interconnect structure, and wherein the first surface of each of the integrated circuit packages is perpendicular to the first surface of the interconnect structure; and a fan module located in a slot of the housing structure, wherein the fan module includes a fan that directs an airflow over the integrated circuit modules.

2. The multi-package module of claim 1, wherein the slot containing the fan module is positioned orthogonal to the slots containing the integrated circuit packages.

3. The multi-package module of claim 1, wherein the slot containing the fan module is positioned parallel to the slots containing the integrated circuit packages.

4. A multi-package module comprising:

an interconnect structure having a plurality of interconnect terminals exposed at an upper surface thereof;

a housing structure having a lower surface and an opposing upper surface, wherein the lower surface of the housing structure is attached to the upper surface of the interconnect structure, the housing structure having a plurality of slots through which the interconnect terminals are exposed, wherein each of the slots extends from the lower surface to the opposing upper surface of the housing structure;

a plurality of integrated circuit packages, each having a first set of contact terminals located along a first surface thereof, wherein each of the integrated circuit packages is positioned within a corresponding one of the slots of the housing structure, such that the first set of contact terminals of each integrated circuit package are in contact with a corresponding set of the interconnect terminals of the interconnect structure, and wherein the first surface of each of the integrated circuit packages is perpendicular to the upper surface of the interconnect structure;

a lid removably attached to the housing structure, wherein the lid extends over the slots in the housing structure, thereby retaining the integrated circuit packages in the slots; and spring-loaded elements located between the lid and the integrated circuit packages, wherein the spring-loaded elements force the integrated circuit packages into the slots.

* * * * *